(12) United States Patent
Jiang

(10) Patent No.: US 11,195,688 B2
(45) Date of Patent: Dec. 7, 2021

(54) ADJUSTING MECHANISM FOR ADJUSTING DEFORMATION OF PANEL AND ELECTRON BEAM DETECTION APPARATUS COMPRISING THE SAME

(71) Applicant: Zhongke Jingyuan Electron Limited, Beijing (CN), Beijing (CN)

(72) Inventor: Lei Jiang, Beijing (CN)

(73) Assignee: Zhongke Jingyuan Electron Limited, Beijing (CN), Beijing (CN)

( * ) Notice: Subject to any disclaimer, the term of this patent is extended or adjusted under 35 U.S.C. 154(b) by 19 days.

(21) Appl. No.: 16/730,394

(22) Filed: Dec. 30, 2019

(65) Prior Publication Data

US 2021/0159045 A1    May 27, 2021

(30) Foreign Application Priority Data

Nov. 27, 2019   (CN) .......................... 201911179475.0

(51) Int. Cl.
*H01J 37/20* (2006.01)
*H01J 37/26* (2006.01)
*H01J 37/28* (2006.01)

(52) U.S. Cl.
CPC ............ *H01J 37/20* (2013.01); *H01J 37/263* (2013.01); *H01J 37/28* (2013.01)

(58) Field of Classification Search
CPC .. H01J 37/00; H01J 37/02; H01J 37/20; H01J 37/28; H01J 37/263; H01J 37/023; H01J 37/261
USPC ................................ 250/306, 307, 310, 311
See application file for complete search history.

(56) References Cited

U.S. PATENT DOCUMENTS

2006/0028098 A1\* 2/2006 Kim ..................... H02N 2/0095
310/328

\* cited by examiner

*Primary Examiner* — Jason L McCormack
(74) *Attorney, Agent, or Firm* — Hamre, Schumann, Mueller & Larson, P.C.

(57) ABSTRACT

An adjusting mechanism for adjusting a deformation of a panel and an electron beam detection apparatus comprising the same are disclosed, the adjusting mechanism including: a support plate, which is provided opposite to the panel, with a periphery of the support plate being in positive fit with a periphery of the panel; and at least one screw set, each screw set comprising: at least one first screw, each first screw penetrating through the support plate, and in turn being connected to the panel by being screwed into the panel; and at least one second screw, each second screw being screwed to penetrate through the support plate and to abut against the panel; the support has its structural rigidity larger than a structural rigidity of the panel.

19 Claims, 3 Drawing Sheets

ADJUSTING MECHANISM FOR ADJUSTING DEFORMATION OF PANEL AND ELECTRON BEAM DETECTION APPARATUS COMPRISING THE SAME

CROSS-REFERENCE TO RELATED INVENTION

The present disclosure claims the benefit of Chinese Patent Application Invention No. 201911179475.0 filed on Nov. 27, 2019 in the China National Intellectual Property Administration, the whole disclosure of which is incorporated herein by reference.

BACKGROUND OF THE DISCLOSURE

Field of the Disclosure

The present disclosure relates to the technical field of semiconductor detection, in particular to an adjusting mechanism for adjusting a deformation of a panel and an electron beam detection apparatus comprising the same.

Description of the Related Art

In a manufacturing process of a semiconductor device (e.g., a semiconductor silicon wafer), an electron beam detection device, for example a scanning electron microscope, is used to detect defects of the semiconductor device which appear in the manufacturing process (e.g., by implementing a detection of pattern(s) of the silicon wafer), the defects comprising but being not limited to detects of the silicon wafer incurred in a lithography process implemented thereon, defects of the silicon wafer incurred in an exposure process implemented thereon, and the like. The electron beam detection device operates on the basis of a main operating principle lying in that, a high-power electron beam is used to impinge on a surface of an object to be detected, and secondary electrons, backscattered electrons and the like are then generated by the impingement of the electron beam on the surface, and are captured to generate an electric signal embodying various kinds of physical and chemical information of the object to be detected, such as surface topography of the surface of the object to be detected, components of the object to be detected, and the like. Similar to an optical microscope, a scanning electron microscope (i.e., SEM) can obtain a better image definition merely within a scope of the depth of field thereof, and the can provide an optimal resolution at an optimal operation distance ("operation distance" is defined as a distance between a lower surface of a pole piece of an object lens in the scanning electron microscope and a sample for example carried on a stage of the scanning electron microscope) or an optimal object distance. However, it may be difficult for the scanning electron microscope to achieve the optical operation distance or the optimal object distance, due to respective errors of the scanning electron microscope, a chamber accommodating the scanning electron microscope (which chamber is typically in a vacuum condition therein), and the stage of the scanning electron microscope, in machining and assembly thereof, as well as respective deformations of the scanning electron microscope, the chamber, and the stage which deformations are caused by high vacuum.

SUMMARY OF THE DISCLOSURE

The embodiments of the present disclosure have been made to overcome or alleviate at least one aspect of the above mentioned disadvantages and/or shortcomings in the relevant art, by providing an adjusting mechanism for adjusting a deformation of a panel and an electron beam detection apparatus comprising the same.

Specific technical solutions of the embodiments of the present disclosure are provided as follows, so as to achieve above purposes.

According to one aspect of embodiments of the disclosure, there is provided an adjusting mechanism for adjusting a deformation of a panel, comprising: a support plate, which is provided opposite to the panel, with a periphery of the support plate being in positive fit with a periphery of the panel; and at least one screw set, each screw set comprising: at least one first screw, each first screw penetrating through the support plate, and in turn being connected to the panel by being screwed into the panel; and at least one second screw, each second screw being screwed to penetrate through the support plate and to abut against the panel; the support plate has its structural rigidity larger than a structural rigidity of the panel.

According to embodiments of the disclosure, at least one smooth through-hole is formed in the support plate, and at least one first threaded hole is formed in the panel to align in one-to-one correspondence with the at least one smooth through-hole respectively, each first screw being arranged to penetrate through respective smooth through-hole and in turn to be threaded into a respective first threaded hole in screw-thread fit, and being configured to be screwed to pull the panel in a direction facing towards the support plate;

and at least one second threaded hole is formed in the support plate, each second screw being arranged to penetrate through a respective second threaded hole in screw-thread fit and in turn to abut at a free end thereof against a surface of the panel facing towards the support plate, and being configured to be screwed to push at the free end thereof against the panel in a direction facing away from the support plate.

According to embodiments of the disclosure, the panel is formed by a first metal material, the support plate, the at least one first screw and the at least one second screw are formed by a second metal material, and the second metal material has its elasticity modulus greater than an elasticity modulus of the first metal material.

According to embodiments of the disclosure, the first metal material is aluminum alloy and the second metal material is stainless steel.

According to embodiments of the disclosure, the adjusting mechanism further comprises: at least one bushing, each bushing having an external thread and an internal thread, and being arranged to be sleeved on a circumferential external side of a respective second screw in screw-thread fit and to be accommodated in a respective second threaded hole in screw-thread fit.

According to embodiments of the disclosure, the bushing is formed by brass.

According to embodiments of the disclosure, the free end is in the form of a ball head.

According to embodiments of the disclosure, the adjusting mechanism further comprises a lining pad, which is embedded within a side of the panel facing towards the support plate and aligned with the free end, and a material of the lining pad has its hardness larger than that of the second metal material.

According to embodiments of the disclosure, the material of the lining pad is tungsten.

According to embodiments of the disclosure, a plurality of reinforcing ribs are formed on and protrude from a side of the periphery of the support plate facing toward the panel.

According to embodiments of the disclosure, a plurality of recesses are formed on a side of the periphery of the panel facing toward the support plate, and are aligned in one-to-one correspondence with and in a positive fit with the plurality of reinforcing ribs, respectively.

According to embodiments of the disclosure, a first hole is formed through the panel, and a second hole is formed through the support plate and is arranged around an axis which is the same as that of the first hole, with an orthogonal projection of the second hole on the panel covering the first hole, and the at least one screw set comprises a plurality of screw sets arranged around the axis and spaced apart from one another at equal angles in a circumferential direction.

According to embodiments of the disclosure, the first hole is centrally arranged in the panel and the second hole is centrally arranged in the support plate.

According to embodiments of the disclosure, the at least one screw set comprises eight screw sets arranged around the axis and spaced apart from one another at equal angles in the circumferential direction.

According to embodiments of the disclosure, each screw set comprises a first screw and a second screw both of which are arranged radially around the axis, and the second screw is positioned radially outwardly of the first screw.

According to embodiments of the disclosure, each screw set comprises a first screw and a plurality of second screws arranged around the first screw.

According to embodiments of the disclosure, the plurality of second screws are spaced part from one another at equal angles around the first screw.

According to another aspect of the exemplary embodiment of the present disclosure, there is provided an electron beam detection apparatus, comprising the regulating mechanism as above, further comprising: the panel; a box, which is opened at one side thereof and is in snap fit with the panel to jointly define therebetween a first chamber in a vacuum condition; an electron beam detection device, comprising a scanning electron microscope which is assembled at a periphery of a lens barrel thereof hermetically into the first hole of the panel; and a stage, which is configured carry and hold an object to be detected and is translatable in two directions orthogonal to each other; in a condition that the at least one first screw of each screw set pulls the panel closely and the at least one second screw of each screw set pushes against the panel closely, an object distance of the scanning electron microscope is the object distance in a state that the scanning electron microscope achieves an optimal image resolution.

BRIEF DESCRIPTION OF THE DRAWINGS

Embodiments of the disclosure are depicted merely by way of example, by referring to accompanying schematic drawings at present, wherein corresponding reference numerals in the drawings represent corresponding components. The drawings are briefly depicted as follows.

DETAILED DESCRIPTION OF PREFERRED EMBODIMENTS OF THE INVENTION

Figure 1:
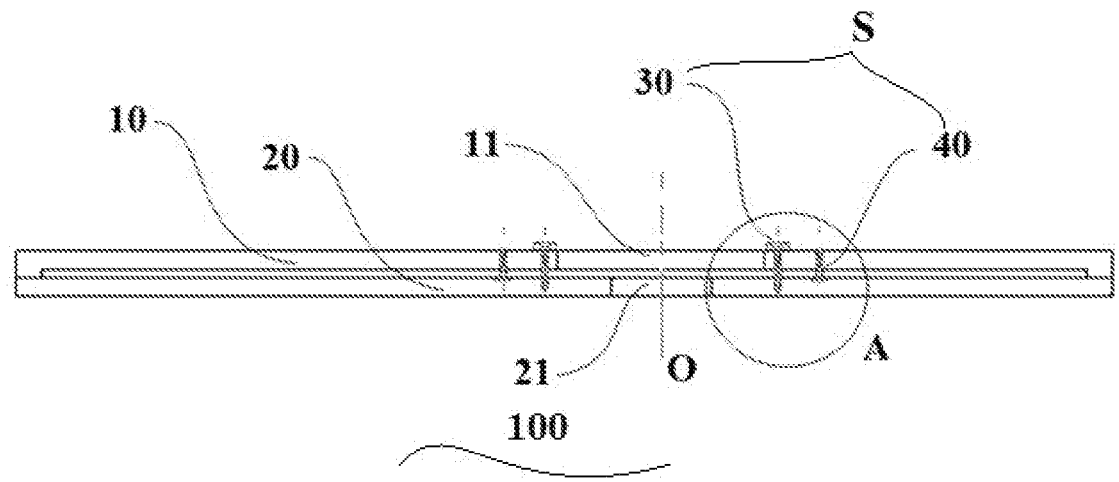
FIG. 1 illustrates a structural schematic view of an adjusting mechanism for adjusting a deformation of a panel according to embodiments of the disclosure.

The technical scheme of the present disclosure will be further explained in detail in combination with the accompanying drawings. In the specification, the same or similar reference numerals and letters indicate the same or similar parts. The following description of embodiments of the present disclosure with reference to the accompanying drawings is intended to explain the general inventive concept of the present disclosure and should not be construed as a limitation of the present disclosure.

The accompanying drawings are used to illustrate the contents of the present disclosure. The dimensions and shapes of the components in the drawings do not reflect the true proportions of the components of an adjusting mechanism for adjusting a deformation of a panel and an electron beam detection apparatus.

FIG. 1 illustrates a structural schematic view of an adjusting mechanism for adjusting a deformation of a panel according to embodiments of the disclosure.

According to a general technical concept of embodiments of the disclosure, as illustrated in FIG. 1, in one aspect of embodiments of the disclosure, an adjusting mechanism 100 for adjusting a deformation of a panel 20 is provided, the adjusting mechanism 100 comprises a support plate 10 and at least one screw set S, the support plate 10 is provided opposite to the panel 20, with a periphery of the support plate 10 being in positive fit with a periphery of the panel 20; and each screw set comprises: at least one first screw 30, each first screw 30 penetrating through the support plate 10, and in turn being connected to the panel 20 by being screwed into the panel 20; and at least one second screw 40, each second screw 40 being screwed to penetrate through the support plate 10 and to abut against the panel 20; the support plate 10 has its structural rigidity larger than a structural rigidity of the panel 20.

By such an arrangement, each first screw 30 is screwed so as to be connected with the panel 20 in a threaded connection thereto, facilitating pulling the support plate 10 towards the panel 20, in other words, in consideration that each first screw 30 here functions as an medium of an interaction between the support plate 10 and the panel 20, it may also be referred to as "pulling the panel 20 towards the support plate 10"; and each second screw 40 is screwed, for example to abut at a free end thereof against the panel 20, facilitating pushing the support plate 10 by abutting against the panel 20, in other words, in consideration that each first screw here functions as an medium of an interaction between the support plate 10 and the panel 20, it may also be referred to as "pushing the panel 20 by abutting against the support plate 10". Moreover, since the support plate 10 has its structural rigidity larger than a structural rigidity of the panel 20, the panel 20 is easier to deform than the support plate 10, such that respective adjusting/regulating effects of both the at least one first screw 30 and the at least one second screw 40 cooperate with each other, by exploiting respective screwing of both the at least one first screw 30 and the at least one second screw 40, respectively, so as to implement an adjustment of the deformation of the panel.

Figure 2:
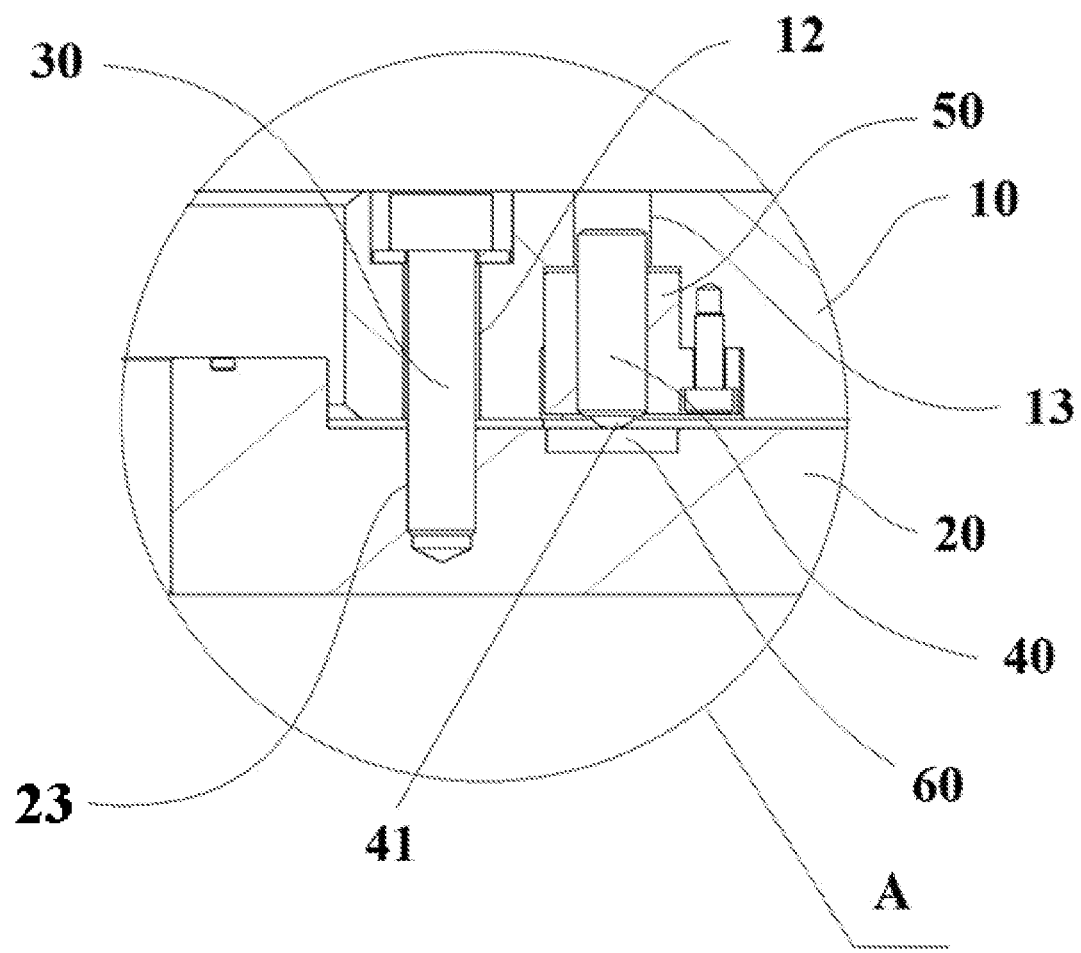
FIG. 2 illustrates a partial enlarged view of a portion as illustrated in FIG. 1, which portion is within a circle which is labeled by circle 'A'.

FIG. 2 illustrates a partial enlarged view of a portion as illustrated in FIG. 1, which portion is within a circle which is labeled by circle 'A'. According to embodiments of the disclosure, by way of example, as illustrated in FIG. 2, specifically, at least one smooth through-hole 12 (e.g., in the form of a counter-bore) is formed in the support plate 10, and at least one first threaded hole 23 is formed in the panel 20 to align in one-to-one correspondence with the at least one smooth through-hole 12 respectively, each first screw 30 being arranged to penetrate through respective smooth through-hole 12 and in turn to be threaded into a respective first threaded hole 23 in screw-thread fit, and being configured to be screwed to pull the panel 20 in a direction facing towards the support plate 10; and at least one second threaded hole 13 is formed in the support plate 10, each second screw 40 being arranged to penetrate through a respective second threaded hole 13 in screw-thread fit and in turn to abut at a free end 41 thereof against a surface of the panel 20 facing towards the support plate 10 (i.e., such a surface is illustrated to be an upper surface of the panel 20), and being configured to be screwed to push at the free end 41 thereof against the panel 20 in a direction facing away from the support plate 10.

In such specific embodiments, since each first screw 30 merely forms a screw-thread fit in a respective first threaded hole 23 formed in the panel 20, and each second screw 40 merely forms a screw-thread fit in a respective second threaded hole 13 penetrating the support plate 10 and abuts at the free end 41 against the panel 20, then, as each first screw 30 is screwed, it has an effect of pulling the panel 20 towards the support plate 10; and as each second screw 40 is screwed, it has an effect of pushing at the free end 41 thereof against the panel 20 away from the support plate 10. Therefore, by a cooperation between both the pulling of the panel 20 by the at least one first screw 30 and the pushing of the panel 20 by the at least one second screw 40, it facilitates that the panel is adjusted to an expected degree of deformation thereof, e.g., the panel which is deformed already (e.g., deformed to be convex downwards) is adjusted back into a undeformed condition, thus ensuring that the surface(s) of the panel may be entirely in a flat state.

According to embodiments of the present disclosure, for example, the panel 20 is formed by a first metal material, the support plate 10, the at least one first screw 30 and the at least one second screw 40 are formed by a second metal material, and the second metal material has its elasticity modulus greater than an elasticity modulus of the first metal material. More specifically, for example, the first metal material is aluminum alloy and the second metal material is stainless steel. As such, it facilitates that the structural rigidity of the support plate 10 is greater than the structural rigidity of the panel 20.

In addition, according to embodiments of the present disclosure, for example, the adjusting mechanism 100 further comprises at least one bushing 59, each bushing 50 has an external thread and an internal thread, and is arranged to be sleeved on a circumferential external side of a respective second screw 40 in screw-thread fit (i.e., the internal threads of the at least one bushing 50 are in a threaded connection with the external threads of the at least one second screw 40, respectively), and to be accommodated in a respective second threaded hole in screw-thread fit (i.e., the external threads of the at least one bushing 50 are in a threaded connection with the internal threads of the at least one second screw 40, respectively); and moreover, for example, the at least one bushing 50 is formed by brass. Then, as compared with a friction between an inner wall of each second threaded hole 13 of the support plate 10 which is formed by stainless steel and the respective second screw 40 also formed by stainless steel, a friction between each bushing 50 formed by brass and the respective second screw 40 formed by stainless steel is smaller, such that this condition facilitates that a frictional force due to the friction is overcome by applying a reduced screwing force in a more labor-saving manner, and thus facilitates a smoother screwing of said second screw indirectly within the respective second threaded hole for the adjustment as above, compared with the condition in which the each second screw 40 is directly in a threaded connection within the respective second threaded hole 13.

Moreover, according to embodiments of the present disclosure, the free end 41 of each second screw 40 is, for example, in the form of a ball head or a bulb, such that the ball head, which is blunt (i.e., not sharp), is pressed against the panel 20, so as to minimize a scratch or a fracture (i.e., by crushing) of the surface(s) of the panel 20.

Since the ball head of each second screw 40 is formed by a material of stainless steel, and the panel 20 is formed by a material of aluminum alloy, then, when each second screw 40 interacts with the panel 20, a damage to the panel 20 may thus be incurred.

In further embodiments of the present disclosure, by way of example, the adjusting mechanism 100 for example further comprises a lining pad 60, which is embedded within a side of the panel 20 facing towards the support plate 10 and aligned with the free end 41 which is for example in the form of a ball head, and a material of the lining pad (e.g., tungsten) has its hardness larger than that of the second metal material (e.g., stainless steel). Since the at least one second screw 40 presses against the lining pad 60 embedded within the panel 20, rather than directly pressing against the surface of the panel 20, and since the lining pad 60 has its hardness larger than that of the second metal material (e.g., stainless steel) which forms the at least one second screw 40, then, it may minimize the damage to the panel which is possibly caused by the interaction between the at least one second screw 40 for example formed by stainless steel and the panel which is formed by aluminum alloy having a lower elasticity modulus than that of stainless steel during a period when the at least one second screw 40 presses against the panel.

In addition, according to embodiments of the present disclosure, by a reasonable design of respective shapes of the support plate 10 and the panel 20, and the like, it may be implemented that the structural rigidity of the support plate 10 is larger than the structural rigidity of the panel 20.

FIG. 3(*a*) and FIG. 3(*b*) illustrate structural schematic views of a support plate in the adjusting mechanism, in a top view and in a bottom view, respectively; FIG. 4 illustrates in a top view a structural schematic view of a panel for which the adjusting mechanism is used; and FIG. 5 illustrates an exemplary assembly view of the support plate as illustrated in FIG. 3(*a*) and FIG. 3(*b*), and the panel as illustrated in FIG. 4.

By way of example, as illustrated in FIG. 3(*a*) and FIG. 3(*b*), a plurality of reinforcing ribs 14 are formed on and protrude from a side of the periphery of the support plate 10 facing towards the panel 20, and each of the plurality of protruding ribs 14 has a cross section which is for example rectangular in shape. And accordingly, for example as illustrated in FIG. 4, a plurality of recesses 24 are formed on the side of the periphery of the panel 20 facing towards the support plate 10, and are aligned in one-to-one correspondence with and in a positive fit with the plurality of reinforcing ribs 14, respectively. By the positive fit between the plurality of recesses 24 and the plurality of reinforcing ribs 14, a tight bonding and coupling between the support plate 10 and the panel 20 is realized, as illustrated in FIG. 5. Moreover, due to the presence of the plurality of reinforcing ribs 14 on the support plate 10, then the entirety of the support plate 10 with the plurality of reinforcing ribs 14 has an increased structural rigidity as compared with that of a support plate which is flat at surface(s) thereof; furthermore, since the panel 20 is formed with the plurality of recesses 24 thereon, it has a structural rigidity which is reduced somewhat as compared with a panel 20 which is flat at surface(s) thereof. As such, a difference by which the structural rigidity of the support plate is larger than the structural rigidity of the panel may be further increased, such that the panel is more prone to deformation, facilitating implementing the adjustment of deformation of the panel with a higher sensitivity.

Figure 3A:
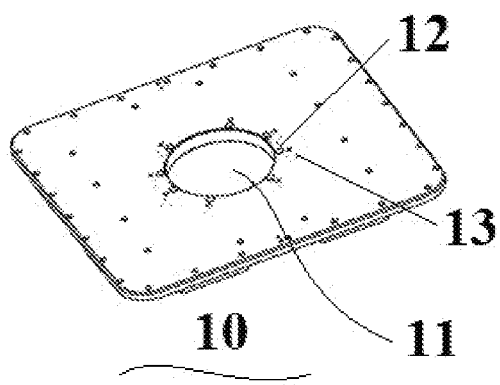
FIG. 3(a) and FIG. 3(b) illustrate structural schematic views of a support plate in the adjusting mechanism, in a top view and in a bottom view, respectively.
Figure 3B:
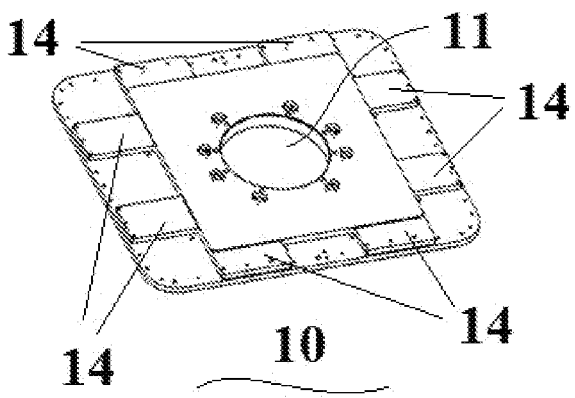
Figure 4:
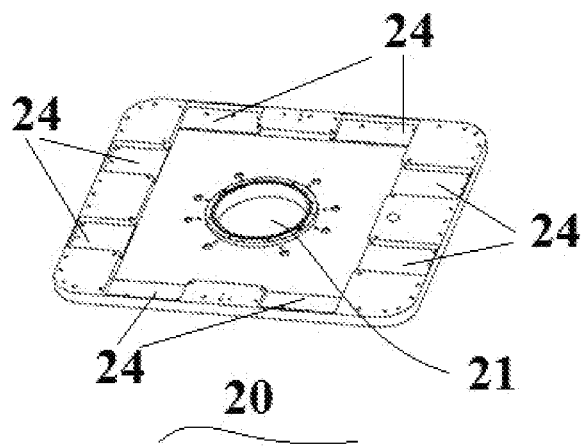
FIG. 4 illustrates in a top view a structural schematic view of a panel for which the adjusting mechanism is used.
Figure 5:
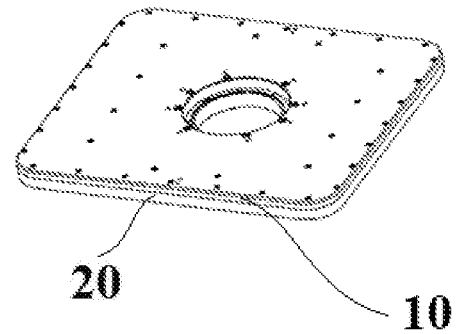
FIG. 5 illustrates an exemplary assembly view of the support plate as illustrated in FIG. 3(a) and FIG. 3(b), and the panel as illustrated in FIG. 4.

In addition, according to embodiments of the present disclosure, for example, as illustrated in FIG. 4, a first hole 21 is formed through the panel 20 (e.g., the first hole 21 is for example arranged centrally in the panel 20), and as illustrated in FIG. 3(a) and FIG. 3(b), a second hole 11 is formed through the support plate 10 and is arranged around an axis O which is the same as that of the first hole 21(the second hole 11 is for example centrally arranged in the support plate 10), with an orthogonal projection of the second hole 11 on the panel 20 covering the first hole 21 (i.e., an orthogonal projection of the second hole 11 on the panel 20 occupies an area which has a scope larger than or equal to a scope of an area occupied by the first hole 21), and the at least one screw set S essentially comprises a plurality of screw sets S arranged around the axis O and spaced apart from one another at equal angles in a circumferential direction. By arranging the plurality of screw sets S spaced apart from one another at equal angles in the circumferential direction, i.e., the plurality of screw sets S evenly distributed in the circumferential direction, e.g., eight sets as illustrated, then, each screw set S is subjected to a respective force applied thereon which is decreased accordingly, avoiding respective local stress which is excessively large.

In further embodiments, as shown in FIG. 3 (a) and FIG. 3 (b) and FIG. 4, in an exemplary arrangement of respective holes of the support plate 10 and the panel 20, both the at least one smooth through-hole 12 and the at least one second threaded hole 13 are arranged radially around the axis O on the support plate 10, corresponding to each screw set S, and the at least one second threaded hole 13 is positioned radially outwardly relative to the smooth through-hole 12; and the at least one first threaded hole 23 are formed to align with the at least one smooth through-hole 12, on the panel 20. Accordingly, each screw set S for example comprises a first screw 30 and a second screw 40 arranged radially around the axis O, and the second screw 40 is positioned radially outwardly relative to the first screw 30. By such an arrangement of holes and such an arrangement of screws fitting with the holes, an adjusting force for implementing the adjustment of the deformation of the panel is homogenized across the whole panel, avoiding the damage to the panel due to the local to stress which is excessively large.

In alternative further embodiments of the present disclosure, for example, in another exemplary arrangement of respective holes of the support plate 10 and the panel 20, both the at least one smooth through-hole 12 and a plurality of second threaded holes 13 arranged around the at least one smooth through-hole 12 respectively, are formed on the support plate 10, corresponding to each screw set S; and the at least one first threaded hole 23 are formed to align with the at least one smooth through-hole 12, on the panel 20; more specifically, by way of example, the plurality of second threaded holes 13 are spaced apart from one another at equal angles around the at least one smooth through-hole 12. Accordingly, each screw set S for example comprises a first screw 30 and a plurality of second screws 40 arranged around the first screw 30; more specifically, by way of example, the plurality of second screws 40 are spaced apart from one another at equal angels around the first screw 30. By such an alternative arrangement of holes and such an alternative arrangement of screws fitting with the holes, the adjusting force for implementing the adjustment of the deformation of the panel is also homogenized across the whole panel, avoiding the damage to the panel due to the local stress which is excessively large.

Figure 6:
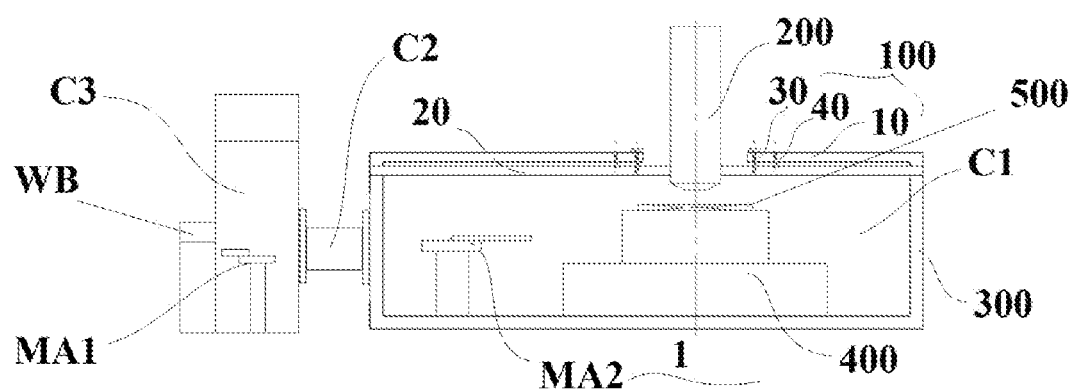
FIG. 6 illustrates a schematic view of an electron beam detection apparatus according to embodiments of the disclosure, comprising the adjusting mechanism as illustrated in FIG. 1.

FIG. 6 illustrates a schematic view of an electron beam detection apparatus according to embodiments of the disclosure, comprising the adjusting mechanism as illustrated in FIG. 1. According to the general technical concept of embodiments of the disclosure, as illustrated in FIG. 6, in another aspect of the embodiment of the disclosure, an electron beam detection apparatus 1 is also disclosed, comprising: the adjusting mechanism 100 as above; the panel 20; a box 300, which is opened at one side thereof (e.g., an upper side thereof as illustrated) and is in snap fit with the panel 20 to jointly define a first chamber C1 in a vacuum condition, between the box and the panel; an electron beam detection device 200, for example comprising a scanning electron microscope which is assembled at a periphery of a lens barrel thereof hermetically into the first hole 21 of the panel 20; and a stage 400, which is configured to carry and hold an object to be detected 500 and is translatable in two directions orthogonal to each other (e.g., x-y directions). And in a condition that the at least one first screw 30 of each screw set S pulls the panel 20 closely and the at least one second screw 40 of each screw set S pushes against the panel 20 closely, an object distance of the scanning electron microscope 200 is the object distance in a state that the scanning electron microscope 200 achieves an optimal image resolution; in other words, the operation distance between a lower surface of a pole piece of an object lens in the scanning electron microscope and the object to be detected 500 (e.g., a wafer to be detected which is located on the stage) is obtained in a state that the scanning electron microscope achieves a clearest image resolution.

With such a setting, for example, as illustrated in FIG. 5, in a condition that the first chamber C1 defined between the box 300 and the panel 20 is in a vacuum condition, then, a surface of the panel 20 at a side thereof facing towards the support plate 10 (i.e., an upper surface thereof as illustrated) is in an atmospheric environment while a surface of the panel 20 at a side thereof facing away from the support plate 10 (i.e., a lower surface thereof as illustrated, facing towards the first chamber C1) is in a vacuum environment, and the lens barrel of the scanning electron microscope 200 is installed within the first hole of 21 the panel 20 by passing therethrough, then, since the support plate 10 is necessarily in the atmospheric environment, the support plate 10 may not be influenced by vacuum; and the upper surface of the panel 20 is in the atmospheric environment while the lower surface is in the vacuum environment, resulting in that an initial deformation of the panel due to an atmospheric pressure, e.g., a concave which projects inwards and downwards, such that an optimal object distance may not be ensured. Due to the existence of the adjusting mechanism 100, then, by adjusting the screwing of both the at least one first screw 30 and the at least one second screw 40, the deformation of the panel may be adjusted; e.g., a vector synthesis is implemented, between a complementary or compensative deformation of the panel caused by a vector of a resultant force due to a composite action of the at least one first screw 30 pulling the panel 20 towards the support plate 10 and the at least one second screw 40 pushing against the panel 20 away from the support plate 10, and the initial deformation of the panel due to a pressure difference which is formed between the upper surface of the panel in the atmospheric environment and the lower surface of the panel in the vacuum environment, so as to adjust the degree of the deformation of the panel for facilitating the optimal object distance of the scanning electron microscope.

More specifically, for example, the electron beam detection apparatus 1 further comprises: a second chamber C2, which is provided adjacent to the first chamber C1, the second chamber C2 communicating at one side thereof with the first chamber C1 via a first valve, and communicating at the other side thereof opposite to the one side with the atmospheric environment via a second valve; a first mechanical arm MA1, which is provided outside the second chamber C2 and configured to move the object to be detected 500 into the second chamber C2 from the atmospheric environment (e.g., from a wafer box WB); and a second mechanical arm MA2, which is provided within the first chamber C1 and configured to move the object to be detected 500 into the first chamber C1 from the second chamber C2, and in turn to the top surface of the stage 400.

By providing the second chamber C2 which functions as a transition region between the atmospheric environment and the first chamber C1 serving as an operative environment, an detection operation of the electron beam detection apparatus within the first chamber C1 may be carried out while the second chamber C2 is vacuumized, thereby realizing a continuous detection process of a transmission and the detection of the semiconductor device (e.g., the silicon wafer) both implemented in parallel.

Also, in embodiments of the disclosure, by way of example, the second chamber C2 is configured to be vacuumized when both the first valve and the second valve are turned off at the same time. It is ensured that the electron beam detection apparatus subsequently operates in a vacuum environment, not only avoiding the interference of the environment with the detection but also avoiding the attenuation of the electron beam due to the atmosphere.

In addition, in embodiments of the present disclosure, a volume of the second chamber C2 is smaller than that of the first chamber C1. Therefore, since the second chamber C2 is provided to function as the transition region between the atmospheric environment and the first chamber C1 serving as an operative environment, and since the volume of the second chamber C2 is smaller than that of the first chamber C1, then, the second chamber C2 is vacuumized at a faster speed than a speed at which the first chamber C1 is vacuumized. When it is desired to transfer the silicon wafer to the first chamber C1 from the atmosphere, the second chamber C2 above all reaches the atmospheric condition; and since the first chamber C1 is spaced apart from the second chamber C2 by the first valve, then the first chamber C1 is still in the vacuum condition. The silicon wafer is above all delivered into the second chamber C2, and then the second chamber C2 is vacuumized (since it has a relatively smaller volume than that of the first chamber, it may be vacuumized quickly to reach the vacuum condition), and next the first valve is opened so as to allow the silicon wafer to pass therethrough into the first chamber C1. As such, the detection efficiency of the electron beam detection apparatus may be enhanced significantly. When two or more silicon wafers are placed within the second chamber C2, a normal detection in the first chamber C1 may be implemented during the delivery of the silicon wafer.

The electron beam detection assembly according to embodiments of the disclosure comprises aforementioned adjusting mechanism, and thus may have same or similar specific structure and technical effects as compared with the latter, without being repeated herein any more.

The embodiment of the disclosure has the following superior technical effects:

An adjusting mechanism for adjusting a deformation of a panel and an n electron beam detection apparatus comprising the same are provided in embodiments of the present disclosure. By adjusting respective degrees of screwing of both the at least one first screw (which penetrates through the support plate and is connected to the panel by being screwed into the panel) and the at least one second screw (which penetrates through the support plate and abuts against the panel), the deformation of the panel may be adjusted; e.g., a vector synthesis is implemented, between a complementary or compensative deformation of the panel caused by a vector of a resultant force due to a composite action of the at least one first screw pulling the panel towards the support plate and the at least one second screw pushing against the panel away from the support plate, and the initial deformation of the panel, so as to adjust the panel to a degree of deformation as desired. And by using the adjusting mechanism in the electron beam detection apparatus, it facilitates the optimal object distance of the electron beam detection device contained therein (e.g., the scanning electron microscope).

In addition, according to the aforementioned embodiments of the present disclosure, it can be understood that any technical solution formed by any two or more combinations also falls into the scope of protection of the present disclosure.

The embodiments of the present disclosure are described in a progressive manner. Each embodiment focuses on respective differences from other embodiments, and the same/similar parts among embodiments can be referred to each other or one another.

The above is only a better embodiment of the invention and does not limit the invention. Any modification, equivalent replacement, improvement, and the like made within the spirit and principles of the invention shall be comprised in the protection scope of the invention.

What is claimed is:

1. An adjusting mechanism for adjusting a deformation of a panel, comprising:
   a support plate, which is provided opposite to the panel, with a periphery of the support plate being in positive fit with a periphery of the panel; and
   at least one screw set, each screw set comprising:
   at least one first screw, each first screw penetrating through the support plate, and in turn being connected to the panel by being screwed into the panel; and
   at least one second screw, each second screw being screwed to penetrate through the support plate and to abut against a surface of the panel facing towards the support plate, without being screwed into the panel,
   wherein the support plate has its structural rigidity larger than a structural rigidity of the panel.

2. The adjusting mechanism according to claim 1, wherein, at least one smooth through-hole is formed in the support plate, and at least one first threaded hole is formed in the panel to align in one-to-one correspondence with the at least one smooth through-hole respectively, each first screw being arranged to penetrate through respective smooth through-hole and in turn to be threaded into a respective first threaded hole in screw-thread fit, and being configured to be screwed to pull the panel in a direction facing towards the support plate; and at least one second threaded hole is formed in the support plate, each second screw being arranged to penetrate through a respective second threaded hole in screw-thread fit and in turn to abut at a free end thereof against a surface of the panel facing towards the support plate, and being configured to be screwed to push at the free end thereof against the panel in a direction facing away from the support plate.

3. The adjusting mechanism according to claim 2, wherein the panel is formed by a first metal material, the support plate, the at least one first screw and the at least one second screw are formed by a second metal material, and the second metal material has its elasticity modulus greater than an elasticity modulus of the first metal material.

4. The adjusting mechanism according to claim 3, wherein the first metal material is aluminum alloy and the second metal material is stainless steel.

5. The adjusting mechanism according to claim 4, further comprising: at least one bushing, each bushing having an external thread and an internal thread, and being arranged to be sleeved on a circumferential external side of a respective second screw in screw-thread fit and to be accommodated in a respective second threaded hole in screw-thread fit.

6. The adjusting mechanism according to claim 5, wherein the at least one bushing is formed by brass.

7. The adjusting mechanism according to claim 2, wherein the free end is in the form of a ball head.

8. The adjusting mechanism according to claim 3, further comprising a lining pad, which is embedded within a side of the panel facing towards the support plate and aligned with the free end, and a material of the lining pad has its hardness larger than that of the second metal material.

9. The adjusting mechanism according to claim 8, wherein the material of the lining pad is tungsten.

10. The adjusting mechanism according to claim 1, wherein a plurality of reinforcing ribs are formed on and protrude from a side of the periphery of the support plate facing toward the panel.

11. The adjusting mechanism according to claim 10, wherein a plurality of recesses are formed on a side of the periphery of the panel facing toward the support plate, and are aligned in one-to-one correspondence with and in a positive fit with the plurality of reinforcing ribs, respectively.

12. The adjusting mechanism according to claim 1, wherein a first hole is formed through the panel, and a second hole is formed through the support plate and is arranged around an axis which is the same as that of the first hole, with an orthogonal projection of the second hole on the panel covering the first hole, and the at least one screw set comprises a plurality of screw sets arranged around the axis and spaced apart from one another at equal angles in a circumferential direction.

13. The adjusting mechanism according to claim 12, wherein the first hole is centrally arranged in the panel and the second hole is centrally arranged in the support plate.

14. The adjusting mechanism according to claim 12, wherein the at least one screw set comprises eight screw sets arranged around the axis and spaced apart from one another at equal angles in the circumferential direction.

15. The adjusting mechanism according to claim 12, wherein each screw set comprises a first screw and a second screw both of which are arranged radially around the axis, and the second screw is positioned radially outwardly of the first screw.

16. The adjusting mechanism according to claim 12, wherein each screw set comprises a first screw and a plurality of second screws arranged around the first screw.

17. The adjusting mechanism according to claim 16, wherein the plurality of second screws are spaced apart from one another at equal angles around the first screw.

18. An electron beam detection apparatus, comprising the adjusting mechanism according to claim 1, further comprises:

the panel;

a box, which is opened at one side thereof and is in snap fit with the panel to jointly define therebetween a first chamber in a vacuum condition;

an electron beam detection device, comprising a scanning electron microscope which is assembled at a periphery of a lens barrel thereof hermetically into the first hole of the panel; and a stage, which is configured to carry and hold an object to be detected and is translatable in two directions orthogonal to each other;

wherein, in a condition that the at least one first screw of each screw set pulls the panel closely and the at least one second screw of each screw set pushes against the panel closely, an object distance of the scanning electron microscope is the object distance in a state that the scanning electron microscope achieves an optimal image resolution.

19. An adjusting mechanism for adjusting a deformation of a panel, comprising:

a support plate, which is provided opposite to the panel, with a periphery of the support plate being in positive fit with a periphery of the panel; and at least one screw set, each screw set comprising:

at least one first screw, each first screw penetrating through the support plate, and in turn being connected to the panel by being screwed into the panel; and at least one second screw, each second screw being screwed to penetrate through the support plate and to abut against the panel, wherein the support plate has its structural rigidity larger than a structural rigidity of the panel;

at least one smooth through-hole is formed in the support plate, and at least one first threaded hole is formed in the panel to align in one-to-one correspondence with the at least one smooth through-hole respectively, each first screw being arranged to penetrate through respective smooth through-hole and in turn to be threaded into a respective first threaded hole in screw-thread fit, and being configured to be screwed to pull the panel in a direction facing towards the support plate; and at least one second threaded hole is formed in the support plate, each second screw being arranged to penetrate through a respective second threaded hole in screw-thread fit and in turn to abut at a free end thereof against a surface of the panel facing towards the support plate, and being configured to be screwed to push at the free end thereof against the panel in a direction facing away from the support plate.

* * * * *